(12) United States Patent
Imai et al.

(10) Patent No.: US 7,768,149 B2
(45) Date of Patent: Aug. 3, 2010

(54) POWER MODULE

(75) Inventors: Makoto Imai, Toyota (JP); Masaharu Matsui, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 249 days.

(21) Appl. No.: 11/883,486

(22) PCT Filed: Mar. 22, 2006

(86) PCT No.: PCT/JP2006/306400

§ 371 (c)(1),
(2), (4) Date: Aug. 1, 2007

(87) PCT Pub. No.: WO2006/101258

PCT Pub. Date: Sep. 28, 2006

(65) Prior Publication Data

US 2008/0136258 A1    Jun. 12, 2008

(30) Foreign Application Priority Data

Mar. 24, 2005    (JP)    ............................. 2005-086223

(51) Int. Cl.
*H02J 1/00*    (2006.01)

(52) U.S. Cl. ........................................................ 307/11
(58) Field of Classification Search .................... 307/11
See application file for complete search history.

(56) References Cited

U.S. PATENT DOCUMENTS

| | | | |
|---|---|---|---|
| 5,394,008 A * | 2/1995 | Ito et al. | 257/666 |
| 2003/0042624 A1 * | 3/2003 | Shinohara | 257/787 |
| 2004/0228094 A1 | 11/2004 | Ahmed et al. | |
| 2004/0257841 A1 | 12/2004 | Taguchi et al. | |
| 2005/0225949 A1 | 10/2005 | Kollmannsberger et al. | |

FOREIGN PATENT DOCUMENTS

| | | |
|---|---|---|
| JP | A-6-21320 | 1/1994 |
| JP | A-2001-016870 | 1/2001 |
| JP | A-2001-352766 | 12/2001 |
| JP | A-2003-116281 | 4/2003 |
| JP | A-2005-192311 | 7/2005 |
| WO | WO 03/103125 A1 | 12/2003 |

OTHER PUBLICATIONS

Korean Office Action with Translation in Corresponding Foreign Application No. 10-2007-7024358.

* cited by examiner

*Primary Examiner*—Albert W Paladini
*Assistant Examiner*—Hal I Kaplan
(74) *Attorney, Agent, or Firm*—Oliff & Berridge, PLC

(57) ABSTRACT

Inverter circuits formed of a plurality of power semiconductor devices are stored in a casing of a power module. An output terminal provided at one end side of the casing is connected to one inverter circuit. An output terminal provided at the other end side of the casing is connected to another inverter circuit. An output terminal configured to allow electric connection with an output terminal located at the opposite side by a busbar is further provided at each one end side and the other end side. By disposing the busbar appropriately, output from both inverter circuits can be provided from any of the one end side and the other end side. An output terminal configuration can be realized that allows improvement in the degree of freedom for arrangement and versatility in circuit designing with respect to the position relationship with the electric load.

10 Claims, 6 Drawing Sheets

ADVANCING DIRECTION OF VEHICLE

POWER MODULE

TECHNICAL FIELD

The present invention relates to power modules, particularly a power module stored in a casing (package).

BACKGROUND ART

There is employed a power module with a semiconductor switching device constituting a power conversion circuit such as an inverter and converter (power semiconductor device) stored in one package. Since such a power module has the power semiconductor device arranged in an integrated manner within a package, the effect of down-sizing is great.

For example, Japanese Patent Laying-Open No. 2001-16870 discloses a power module having all semiconductor switching devices of an inverter circuit that converts direct current power into alternating current power in one package. This power module is particularly directed to usage as the power supply of an alternating current motor for driving a vehicle such as hybrid vehicles and electric cars. In accordance with the power module disclosed in this publication, the degree of freedom for the vehicle layout can be increased and the adverse effect caused by the magnetic field generated by the current flow at the wiring can be suppressed by reducing the size of the inverter circuit.

The constraint in layout of various devices in a vehicle has become stricter in order to ensure the comfort of the passenger while obtaining loading space (store ability). Therefore, the power module constituting the power supply for driving the alternating current motor as well as the electric load thereof in the aforementioned hybrid vehicles and electric cars are apt to be restricted in space and arrangement when incorporated in a vehicle.

This induces the problem that, depending upon the position relationship between the output terminal of the power module and the electric load such as the alternating current motor, the arrangement of the wiring and busbar for connection therebetween becomes complicated and/or longer in wiring length. In view of the foregoing, the position of the output terminal of the power module had to be designed individually based on the arrangement and position relationship between the power module and the electric load according to the vehicle layout constraint.

Requirement of such an individual dedicated design will lead to the necessity of modifying the design for each type of vehicle on which the power module, for example, is to be mounted. It will be difficult to reduce the fabrication cost since the components cannot be shared. In other words, for power modules with strict constraint in arrangement layout, it is necessary to increase the degree of freedom from the layout perspective even with respect to the configuration of the output terminal from which power is output in addition to reduction in the size of the device itself. However, the aforementioned publication is silent about such a problem, and provides no disclosure or suggestion of measures thereof.

DISCLOSURE OF THE INVENTION

An object of the present invention is to provide a power module with an output terminal configuration that allows increase in the degree of freedom for arrangement and versatility in circuit design with respect to the position relationship with the electric load.

According to an aspect of the present invention, a power module is stored in a casing, and includes a power conversion circuit, and a plurality of output terminals. The power conversion circuit converts the supply power fed from a power source into supply power that is to be fed to an electric load. The plurality of output terminals are formed electrically contactable from outside the casing. The power conversion circuit includes at least one output end to output supply power that is to be fed to the electric load. The plurality of output terminals include a first output terminal connected to the at least one output end, and a second output terminal not directly connected to each output end. The first and second output terminals are arranged electrically connectable by a busbar arranged in the projection profile of the perimeter of the casing.

According to the power module set forth above, the second output terminal arranged electrically connectable to the first output terminal by the busbar is provided in addition to the first output terminal each connected to the output end of the power conversion circuit. By arranging the busbar as necessary, power can be supplied to the electric load using the second output terminal. Since a plurality of output terminals larger in number than the output ends of the power conversion circuit is connectable to the electric load from one side, the region of arranging a connectable electric load can be increased without having to provide a long busbar or wiring outside the casing. Thus, the degree of freedom for arranging the power module and the design versatility related to the arrangement of output terminals can be improved.

In the power module of the present invention, the busbar is preferably arranged to establish electrical connection between the first and second output terminals located at one end side and the other end side, respectively, of the casing.

By the electrical connection set forth above, contact is allowed from both sides of the casing with respect to the same output end of the power conversion circuit. Thus, the degree of freedom for arranging the power module and design versatility related to output terminal arrangement can be further improved.

Particularly in the power module of the present invention, the first output terminal or each of the first and second output terminals is configured to allow connection with the output end of the power conversion circuit by wire bonding.

Accordingly, electrical connection can be established by a simple configuration between the output terminal of the power module and an output end of the power conversion circuit. Particularly, by allowing electric connection of each of the first and second output terminals by wire bonding, different power conversion circuits can be accommodated by the same output terminal arrangement. Thus, design versatility related to the output terminal arrangement can be further improved.

Alternatively, in the power module of the present invention, the power conversion circuit is preferably configured including at least one power semiconductor device. The power module further includes an insulator arranged to cover the power semiconductor device and the output terminal. The busbar is arranged at the outer side of the insulator.

According to the power module set forth above, the provision of the busbar and attachment of the power module can be carried out with the power semiconductor device and output end constituting the power conversion circuit in a covered state. Thus, insulation can be ensured and damage prevented.

According to another aspect of the present invention, a power module is stored in a casing, and includes a power conversion circuit and a plurality of output terminals. The power conversion circuit converts supply power fed from a power source into supply power that is to be fed to an electric load. The plurality of output terminals are configured electrically contactable from outside the casing. The power conversion circuit includes a plurality of output ends to output supply power that is to be fed to the electric load. The plurality of output terminals are arranged divided into a first output terminal group located at one end side of the casing and a second output terminal group located at the other end side of the casing. At least one of the first and second output terminal groups is electrically connected to the plurality of output ends of the power conversion circuit.

According to the power module set forth above, supply power can be output from a plurality of output ends of the power conversion circuit by any of the first output terminal group arranged at one side and the second output terminal group arranged at the other end side of the casing. Therefore, the region of arranging a connectable electric load can be increased without having to provide a long busbar and/or wiring outside the casing. In other words, the degree of freedom for arranging the power module and design versatility related to output terminal arrangement can be improved.

In the power module of the present invention, the first and second output terminal groups are preferably electrically connected to each other by a busbar arranged in the projection profile of the perimeter of the casing.

Since the busbar can be provided with the shortest distance in the power module set forth above, fabrication cost can be reduced.

Further preferably, the power module of the present invention is mounted on a vehicle that includes an alternating current motor functioning as a vehicle motive power source, and the power conversion circuit includes an inverter converting direct-current power from a secondary battery identified as the power source into alternating current power to drive the alternating current motor identified as an electric load.

By virtue of the above-described power module incorporated in a vehicle such as a hybrid vehicle or electric car that includes an alternating current motor as a vehicle motive power source, the degree of freedom for arrangement and design versatility related to output terminal arrangement can be improved for a power module including an inverter to supply power to the alternating current motor.

BEST MODES FOR CARRYING OUT THE INVENTION

Figure 1:
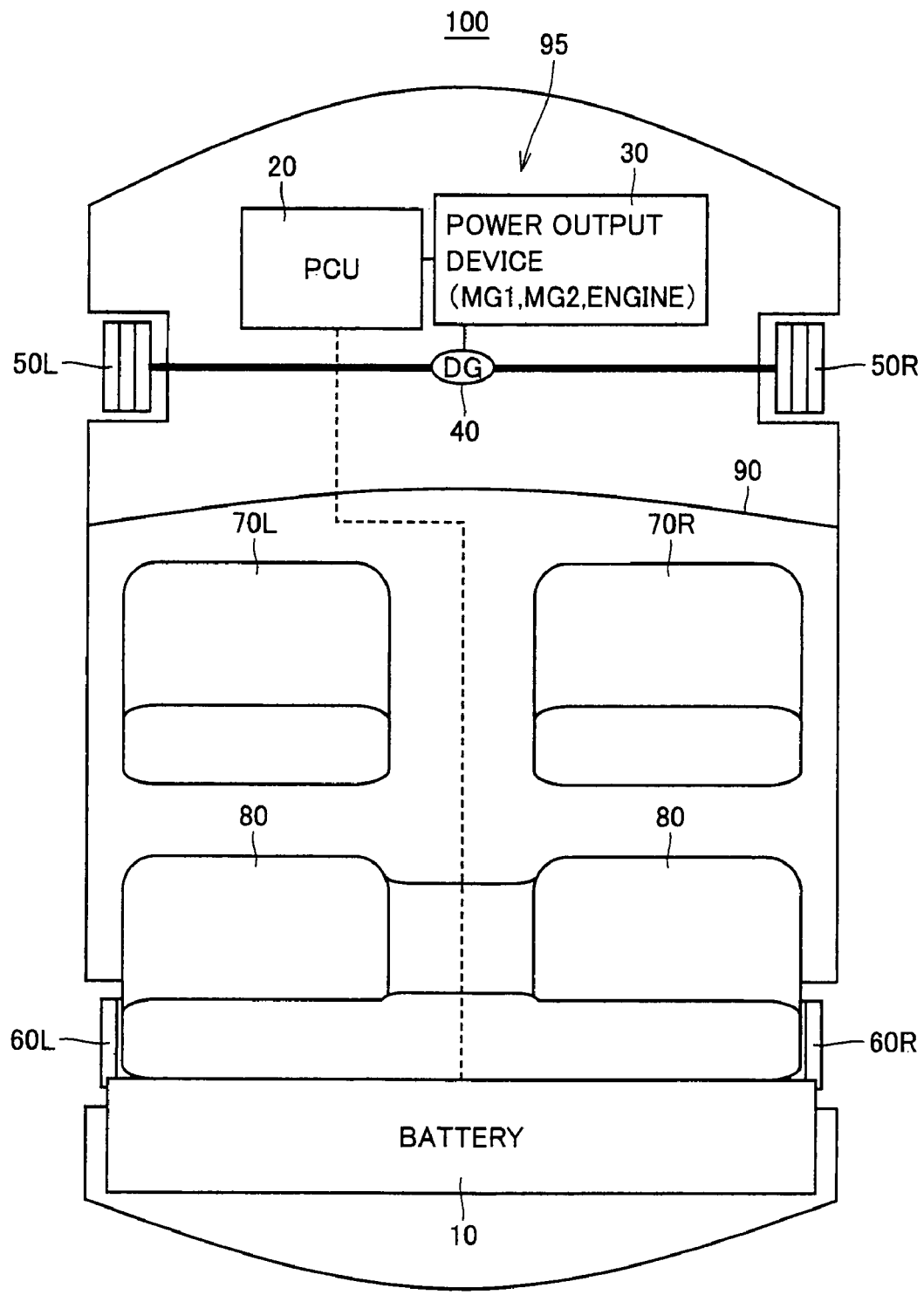
FIG. 1 is a schematic block diagram of a configuration of a hybrid vehicle exemplifying an apparatus on which a power module of the present invention is mounted.

Embodiments of the present invention will be described in detail hereinafter with reference to the drawings. In the drawings, the same or corresponding components have the same reference characters allotted, and detailed description thereof will not be repeated.

FIG. 1 is a schematic block diagram of a configuration of a hybrid vehicle exemplified as an apparatus on which a power module of the present invention is mounted.

Referring to FIG. 1, a hybrid vehicle 100 of the present embodiment includes a battery 10, a PCU (Power Control Unit) 20, a power output device 30, a DG (differential gear) 40, front wheels 50L and 50R, rear wheels 60L and 60R, front seats 70L and 70R, and a rear seat 80.

Battery 10 identified as a "power source" is formed of, for example, a nickel-hydrogen or lithium-ion secondary battery. Battery 10 supplies direct current voltage to PCU 20, and is charged by the direct current voltage from PCU 20. Battery 10 is disposed at the back side, for example, of rear seat 80.

Power output device 30 is disposed at an engine room 95 located at the front side of a dashboard 90. PCU 20 is electrically connected to motor generators MG1 and MG2 in power output device 30. Power output device 30 is coupled to DG 40.

PCU 20 boosts the direct current voltage from battery 10 and converts the boosted direct current voltage into alternating current voltage to drive and control motor generators MG1 and MG2 in power output device 30. In other words, PCU 20 converts the direct current power from battery 10 into alternating current power to drive motor generators MG1 and MG2. PCU 20 converts the alternating current voltage generated by motor generators MG1 and MG2 into direct current voltage to charge battery 10.

Power output device 30 transmits the motive power by the engine and/or motor generators MG1 and MG2 to front wheels 50L and 50R via DG 40 to drive the same. Power output device 30 also generates power by the rotation of motor generators MG1 and MG2 through front wheels 50L and 50R to provide the generated power to PCU 20. In other words, motor generators MG1 and MG2 play the role of an "alternating current motor" functioning as the vehicle motive power source.

DG 40 transmits the power from power output device 30 to front wheels 50L and 50R, and transmits the rotation force of front wheels 50L and 50R to power output device 30.

Figure 2:
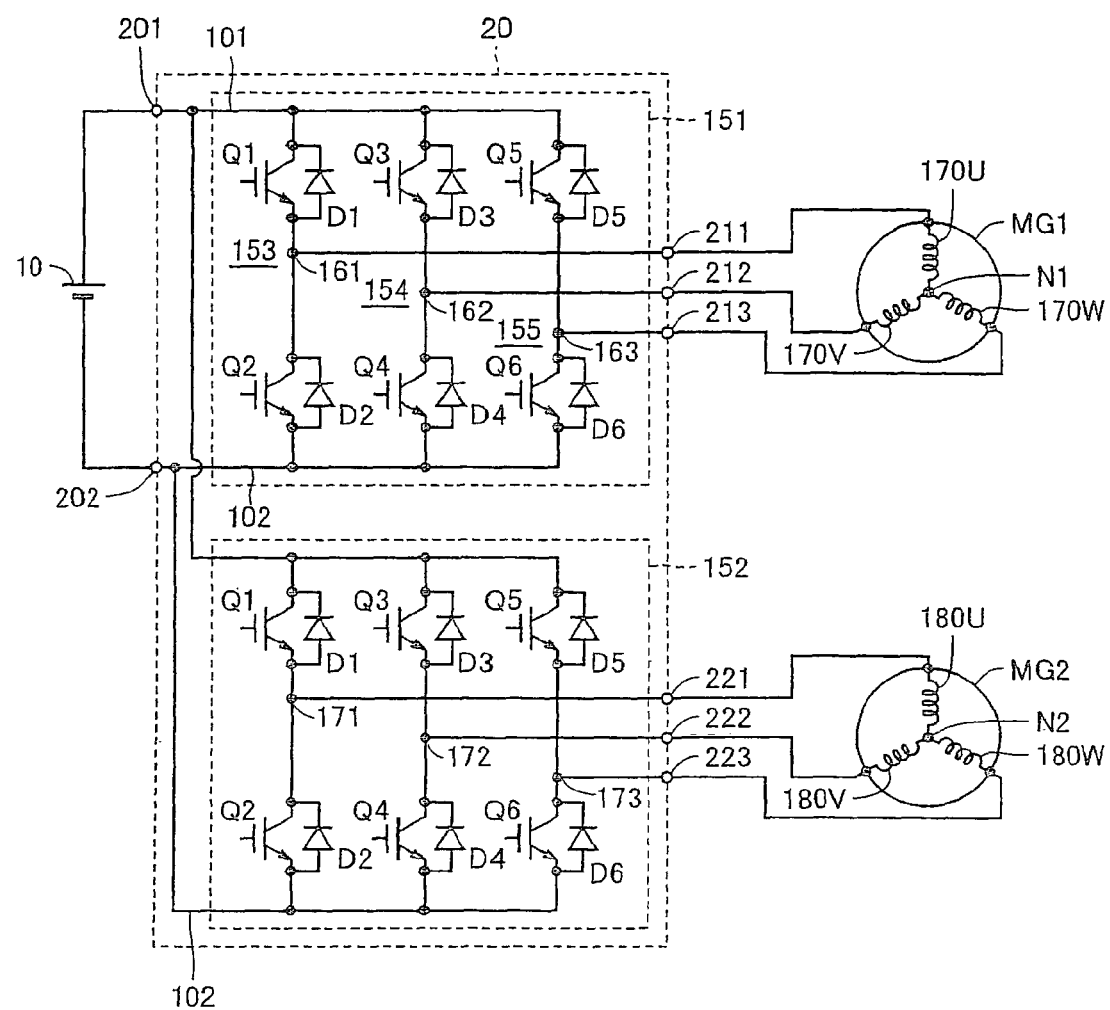
FIG. 2 is an electrical circuit diagram of the PCU (Power Control Unit) shown in FIG. 1.

FIG. 2 is an electric circuit diagram of PCU 20 of FIG. 1.

Referring to FIG. 2, PCU 20 includes inverter circuits 151 and 152 corresponding to motor generators MG1 and MG2, respectively.

A U-phase arm 153, a V-phase arm 154, and a W-phase arm 155 constitute an inverter circuit 151. U-phase arm 153, V-phase arm 154, and W-phase arm 155 are connected in parallel between a power supply line 101 and an earth line 102.

Power supply line 101 is electrically connected to the positive electrode of battery 10 via a PCU terminal 201 for input. Earth line 102 is electrically connected to the negative electrode of battery 10 via a PCU terminal 202 for input. As described above, a configuration in which the converter circuit is arranged in PCU 20 to boost or reduce the direct current voltage applied from battery 10 to PCU terminals 201 and 202 for output onto power supply line 101 and earth line 102 may be taken.

U-phase arm 153 is formed of semiconductor switching devices for power (hereinafter, simply referred to as switching devices) Q1 and Q2 connected in series. V-phase arm 154 is formed of switching devices Q3 and Q4 connected in series. W-phase arm 155 is formed of switching devices Q5 and Q6 connected in series. Diodes D1-D6 conducting current from the emitter side to the collector side are connected across the collector and emitter of switching devices Q1-Q6. Switching devices Q1-Q6 are turned on/off, i.e. switching controlled, in response to a gate signal from a control device not shown. As the switching devices of the present embodiment, IGBTs (Insulated Gate Bipolar Transistors), for example, are employed.

The middle point of each of phase arms 153-155 corresponds to output ends 161-163, respectively, from which the U-phase voltage, the V-phase voltage and the W-phase voltage for driving motor generator MG1 is output. Output ends 161-163 are electrically connected to a U-phase coil 170U, a V-phase coil 170B and a W-phase coil 170W, respectively, of motor generator MG1. Motor generator MG1 is a three-phase permanent magnet motor formed of U-phase coil 170U, V-phase coil 170V and W-phase coil 170W connected in common at neutral point N1.

Inverter circuit 152 has a configuration similar to that of inverter circuit 151. The middle point of each phase arm of inverter circuit 152 corresponds to respective output ends 171-173 from which the U-phase voltage, V-phase voltage and W-phase voltage, respectively, for driving motor MG2 is output. Output ends 171-173 are electrically connected to a U-phase coil 180U, a V-phase coil 180V, and a W-phase coil 180W, respectively, of motor generator MG2 via PCU terminals 221-223 for output. Motor generator MG2 is a 3-phase permanent magnet motor, likewise motor generator MG1, formed of U-phase coil 180U, V-phase coil 180V and W-phase coil 180W connected in common at a neutral point N2.

Figure 3:
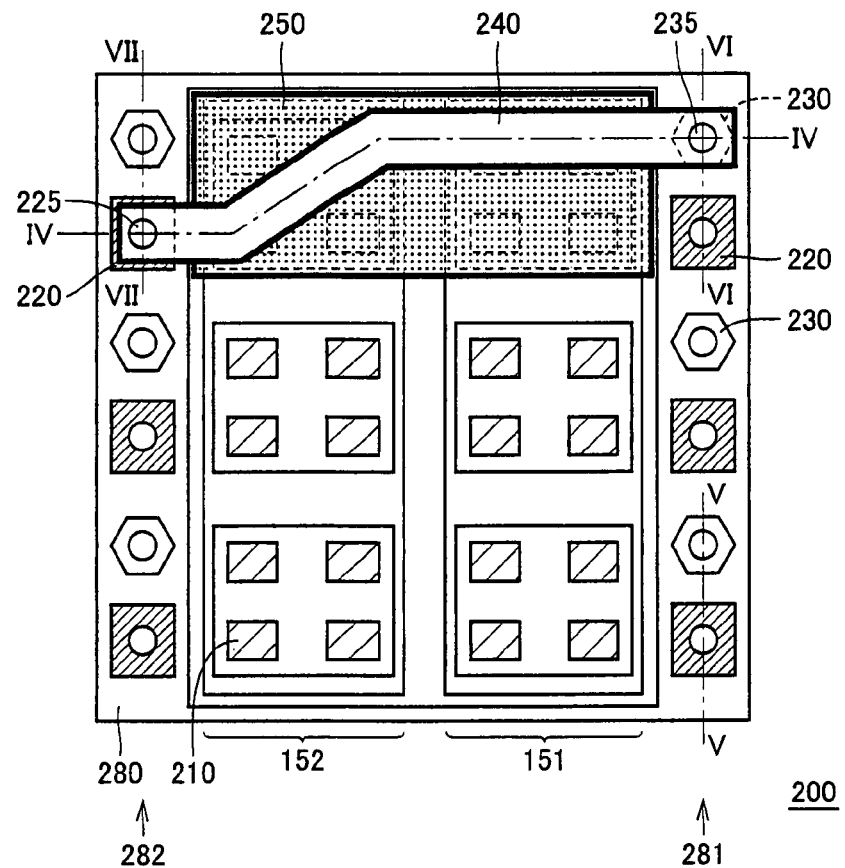
FIG. 3 is a plan view of the power module of FIG. 2 including a switching device.

FIG. 3 is a plan view of a power module 200 in which switching devices constituting inverter circuits 151 and 152 are stored integrally.

Referring to FIG. 3, a plurality of power semiconductor devices 210 constituting inverter circuits 151 and 152 are formed in a casing 280 of power module 200. Power semiconductor device 210 generically represents switching devices Q1-Q6 and diodes D1-D6 constituting each of inverter circuits 151 and 152.

A plurality of output terminals 220 and 230 are aligned at one end side 281 and the other end side 282, respectively, of casing 280 formed of an insulator. Each output terminal is formed of a conductor (typically, metal such as aluminum or copper), and is electrically contactable from outside power module 200.

Output terminal 220 has a configuration allowing electrical connection with the electrode of power semiconductor device 210. Although output terminal 230 is not directly connectable with the electrode of power semiconductor device 210, output terminal 230 can be electrically connected from outside casing 280. Although not shown, output terminals 220 arranged at one end side 281 are electrically connected to a respective one of output ends 161-163 (FIG. 2) of inverter circuit 151, whereas output terminals 220 arranged at the other end side 282 are electrically connected to a respective one of output ends 171-173 (FIG. 2) of inverter circuit 152.

Further, electrical connection can be established, as necessary, between output terminal 230 located at one end side 281 and output terminal 220 located at the other end side 282 by a busbar 240 arranged at the upper region of casing 280, i.e. busbar 240 arranged in the projection profile of the perimeter of casing 280 viewed from a predetermined direction (top plane in FIG. 3). Thus, output terminals 230 aligned at one end side 281 can be electrically connected to output ends 171-173 of inverter circuit 152. In other words, the output power of inverter circuit 152 can be output from the output terminal located at one end side 281.

Although not illustrated in FIG. 3, electrical connection can be established between output terminal 230 located at one end side 282 and output terminal 220 located at one end side 281 by busbar 240. Provision of such a busbar 240 allows output terminals 230 aligned at the other end side 282 to be electrically connected to output terminals 161-163 of inverter circuit 151. In other words, the output power of inverter circuit 151 can be output from the output terminal located at the other end side 282.

Thus, by providing busbar 240, as necessary, in the power module of the present embodiment, power can be output from both of inverter circuits 151 and 152 from any of one end side 281 and the other end side 282.

Under the region where busbar 240 is arranged, insulator 250 is disposed so as to cover power semiconductor device 210 and output ends (not shown).

Figure 4:
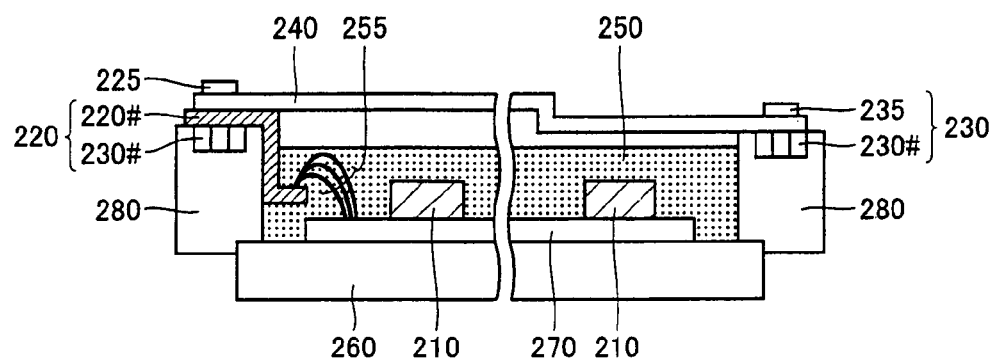
FIG. 4 is a sectional view of the power module taken along lines IV-IV of FIG. 3.

Referring to the sectional view of FIG. 4 taken along line IV-IV in FIG. 3, power semiconductor device 210 is laid out on an insulative substrate 270 formed on a radiating plate 260. The electrode of power semiconductor device 210 is appropriately connected with the wiring pattern (not shown) on insulative substrate 270 such that the electrical circuit configuration of inverter circuits 151 and 152 shown in FIG. 2 is realized. The nodes corresponding to output ends 161-163 and 171-173 on insulative substrate 270 are connected to a conductor plate 220# by a bonding wire 255. The connection between the aforementioned nodes and conductor plate 220# is not limited to wire bonding, and electrical connection can be established between the output end and the conductor plate in a manner other than wire bonding.

Conductor plate 220# is fastened by a bolt 225 to a nut 230# provided on the outer frame of casing 280. Accordingly, conductor plate 220# functions as output terminal 220 (FIG. 3) that provides the output from inverter circuits 151 and 152.

Nut 230# set non-connected with conductor plate 220# that is wire-bonded with output ends 161-163 and 171-173 constitutes output terminal 230 of FIG. 3.

Busbar 240 is fastened by bolt 225 with output terminal 220, and is also fastened by a bolt 235 with nut 230#. Accordingly, electrical connection is established between output terminals 220 and 230 by busbar 240, as shown in FIG. 3.

Insulator 250 is formed of a gel-type material, for example, to seal power semiconductor device 210 located at the surface of power module 200, the wiring pattern on insulative substrate 270, bonding wire 255 and the like to ensure insulation and protection from damage.

Figure 5:
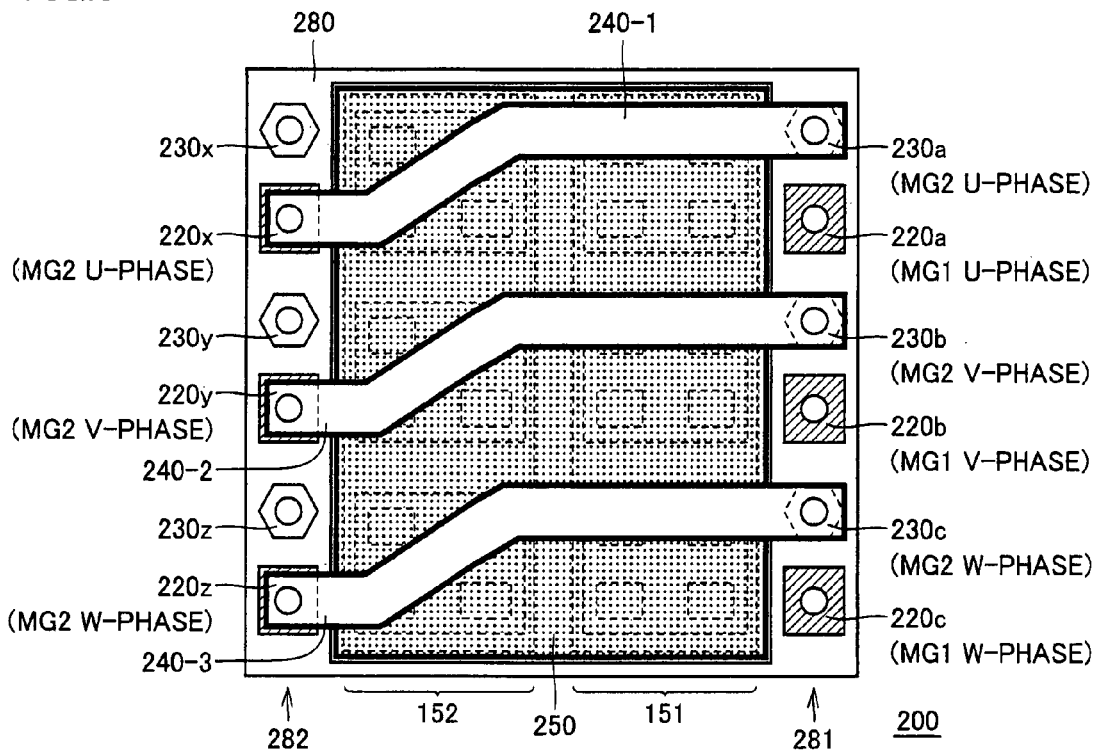
FIGS. 5 and 6 are plan views of first and second examples of a configuration of the power module of the present invention, respectively.

As shown in FIG. 5, by electrically connecting output terminals 230a, 230b and 230c provided at one end side 281 of casing 280 to output terminals 220x, 220y, and 220z, respectively, at the other end side 282 by busbars 240-1-240-3, output can be provided from both of inverter circuits 251 and 252 from either side of casing 280. In other words, electrical connection can be established between power module 200 and motor generators MG1 and MG2 identified as the electric load without having to increase the length of the wiring, even in the case where motor generators MG1 and MG2 are both arranged at one end side 281 of casing 280.

Further, when both motor generators MG1 and MG2 are arranged at the other end side 282 of casing 280, electrical connection can be established between power module 200 and motor generators MG1 and MG2 identified as the electric load, without having to increase the length of the wiring. Such a configuration can also be realized by electrically connecting output terminals 230x, 230y and 230z located at the other end side 282 of casing 280 to output terminals 220a, 220b, and 220c, respectively, located at one end side 281, by busbars 240-1-240-3.

According to power module 200 of the present invention, appropriate arrangement of busbar 240 at the upper region of casing 280 allows power to be supplied to motor generators MG1 and MG2 identified as the electric load from either side of power module 200. In other words, the output terminal design of power module 200 can be shared in common regardless of the positioning relationship with the electric load (motor generators MG1 and MG2). Thus, design versatility of power module 200 as well as the degree of freedom for layout thereof can be improved.

Figure 6:
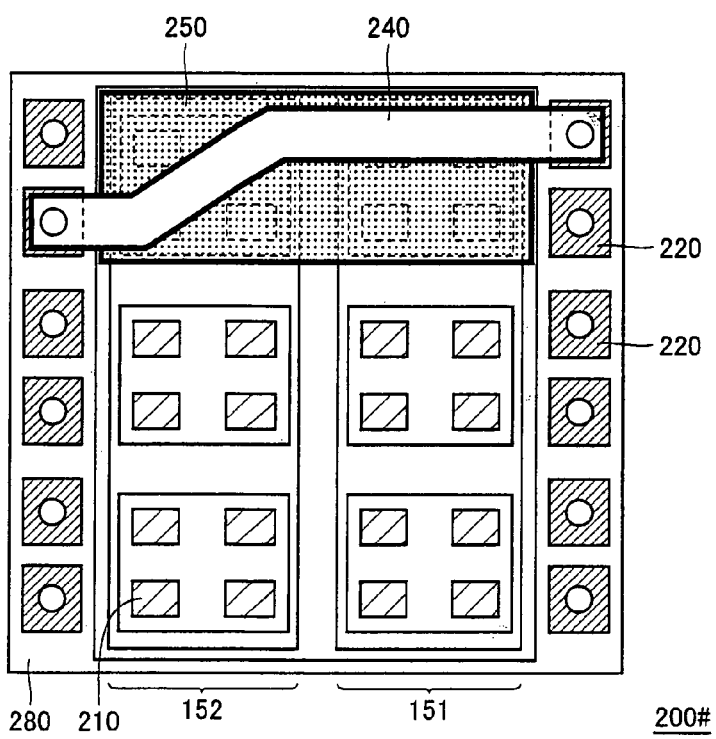

In the power module according to an embodiment of the present invention, each output terminal can be provided as an output terminal 220 connectable to internal power semiconductor device 210 by wire bonding, as shown in FIG. 6. Although conductor plate 220# must be arranged corresponding to each output terminal in this case, the degree of freedom for the connecting relationship between each output terminal and the circuit elements in the power module is improved.

Thus, there is a possibility of allowing common usage of the design of casing 280 and output terminal 220 even in the case where a power conversion circuit other than inverter circuits 151 and 152 is mounted on power module 200. In other words, power module 200# of FIG. 6 allows the design of casing 280 in which a plurality of output terminals 220 are arranged to be used in common even the case where the power conversion circuit incorporated in power module 200# differs. Thus, the circuit design versatility of the power module can be further improved.

The high degree of freedom for arranging the power module according to an embodiment of the present invention will be described hereinafter with reference to FIGS. 7-9.

Figure 7:
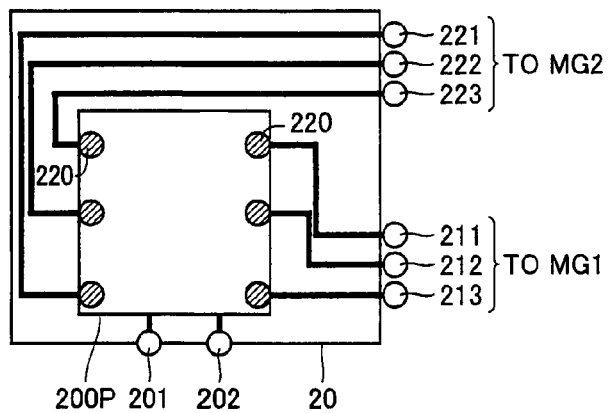
FIG. 7 is a diagram to describe connection between a power module with conventional output terminal configuration and an electric load (motor generator).

FIG. 7 represents a wiring configuration to supply power to motor generators MG1 and MG2 located at one side of a power module having a conventional output terminal configuration.

In a conventional power module 200P of FIG. 7, output terminal 220 connected to the output end corresponding to motor generator MG1 is arranged at one end side 281 of casing 280, whereas output terminal 220 connected to the output end corresponding to motor generator MG2 is arranged at the other end side 282 of casing 280.

In order to dispose PCU terminals 211-213 and 221-223 for output directed to establish connection between PCU 20 and motor generators MG1 and MG2 at one side, a relatively long wiring or busbar for connection between output terminal 220 of power module 200 and PCU terminals 211-213 and 221-223 in PCU 20 must be arranged outside power module 200.

In contrast, power module 200 according to an embodiment of the present invention allows output of both motor generators MG1 and MG2 to be readily provided from either side of PCU 20 by virtue of the arrangement of output terminals 220 and 230 and appropriate arrangement of busbar 240, as set forth above.

Figure 8A:
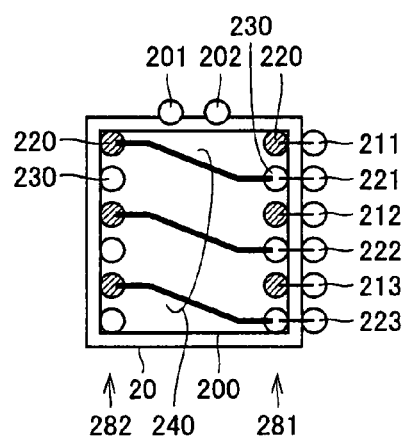
FIGS. 8A and 8B are diagrams to describe connection between a power module according to an embodiment of the present invention and an electric load (motor generator).

According to the configuration shown in FIG. 8A, for example, the arrangement of busbar 240 allows the output from output terminals 220 and 230 located at one end side 281 of power module 200 to be provided to motor generators MG1 and MG2 located at the right side of power module 200 (PCU 20) in the drawing sheet of FIG. 8A.

Figure 8B:
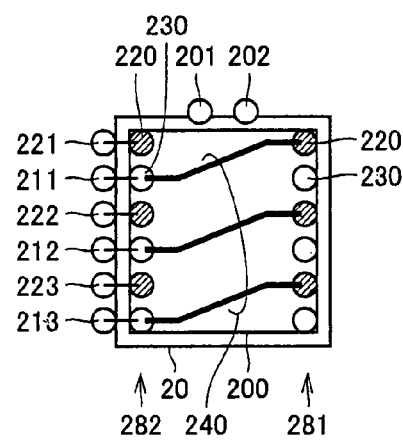

Further, by modifying the arrangement of busbar 240 as shown in FIG. 8B, the output from output terminals 220 and 230 located at the other end side 282 of power module 200 can be provided to motor generators MG1 and MG2 located at the left side of power module 200 (PCU 20) in the drawing sheet.

Thus, in power module 200 according to an embodiment of the present invention, PCU terminals 211-213 and 221-223 for output can be provided corresponding to the arranged position of motor generators MG1 and MG2 without having to provide a long wiring or busbar outside power module 200.

Figure 9:
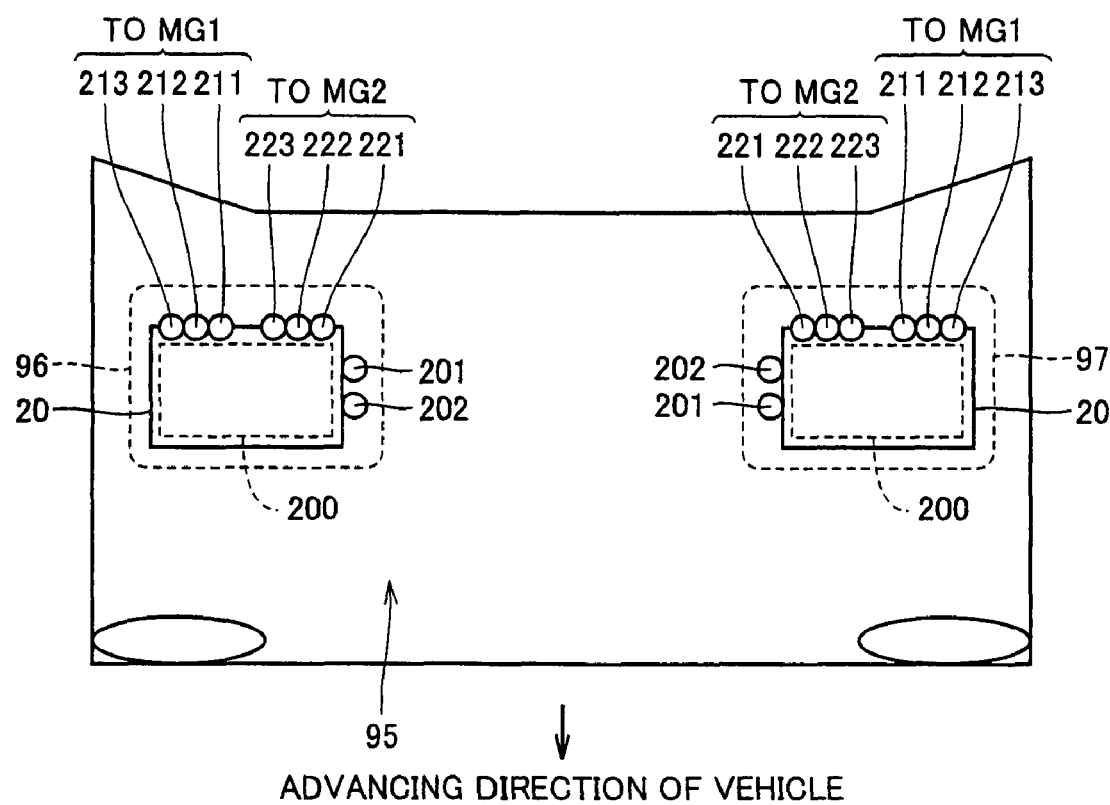
FIG. 9 is a schematic diagram of an example of a power module according to an embodiment of the present invention mounted on a vehicle.

FIG. 9 shows an example of a power module of the present embodiment mounted on a vehicle.

Referring to FIG. 9, power module 200 is arranged in an engine room 95 as a component of PCU 20 (FIG. 1). It is here assumed that motor generators MG1 and MG2 are both located at the rear side of engine room 95 when viewed from the advancing direction of the vehicle.

Therefore, PCU output terminals 211-213 and 221-223 towards motor generators MG1 and MG2 must be located at the upper side on the drawing sheet.

Reflecting the layout constraint between the engine and another apparatus, the mounting at a position 96 or a position 97 may be required depending upon the car type. In other words, there may be the case where PCU 20 formed including power module 200 of the same configuration must be mounted at any of position 96 and position 97, depending upon the car type.

By virtue of power module 200 according to an embodiment of the present invention, PCU 20 (power module 200) can be arranged at position 96 through the arrangement of busbar 240 as shown in FIG. 8B. In the case where PCU 20 (power module 200) is to be arranged at position 97, the arrangement of busbar 240 as shown in FIG. 8A is appropriate. In other words, the output terminals towards motor generators MG1 and MG2 can be provided at any side of PCU 20 without rendering complex the arrangement of the busbar outside power module 200 even in the case where a power module 200 of a common design is employed. Specifically, by modifying the arranging manner of busbar 240, PCU 20 formed including power module 200 can be mounted at both positions 96 and 97. Accordingly, the degree of freedom for arrangement and versatility of power module 200 (PCU 20) can be improved. This increases the range of the car type to which power module 200 with the common design can be applied, allowing the advantage of reducing the cost due to common usage of components.

The embodiment of the present invention has been described in which motor generators MG1 and MG2 which are 3-phase motors are taken as typical examples of an alternating current motor identified as the electric load of the power module of the present invention. Application of the present invention is not limited to such a case, and the present invention is applicable to a power module employed as an arbitrary electrode load without depending upon the form of the electric load. The power module of the present invention is not limited to the mounting application to a hybrid vehicle set forth in the present embodiment, and may be employed in the mounting to various types of vehicles, systems, devices, and the like.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A power module stored in a casing, comprising:
 a power conversion circuit converting supply power fed from a power source into supply power that is to be fed to an electric load, and a plurality of output terminals electrically contactable from outside said casing, said power conversion circuit including at least one output end to output said supply power to said electric load, said plurality of output terminals including a first output terminal connected to said at least one output end, and a second output terminal not directly connected to each said output end, wherein said first and second output terminals are electrically separate members, arranged to be electrically connectable by a busbar disposed within a projection profile of a perimeter of said casing;

the first output terminal being arranged at one end of the casing, the second output terminal being arranged at an opposite end of the casing from the first output terminal, and the power module configured to output from the first and second output terminals to the electric load when the first and second output terminals are connected by the busbar.

2. The power module according to claim 1, wherein said busbar is disposed to establish electrical connection between said first and second output terminals located at one end side and the other end side, respectively, of said casing.

3. The power module according to claim 1, wherein said first output terminal is configured to allow connection with the output end of said power conversion circuit by wire bonding.

4. The power module according to claim 1, wherein each of said first and second output terminals is configured to allow connection with the output end of said power conversion circuit by wire bonding.

5. The power module according to claim 1, wherein said power conversion circuit is configured including at least one power semiconductor device, said power module further comprising an insulator arranged to cover said power semiconductor device and said output end, wherein said busbar is arranged at an outer side of said insulator.

6. A power module stored in a casing, comprising:

a power conversion circuit converting supply power fed from a power source into supply power that is to be fed to an electric load, and a plurality of output terminals electrically contactable to said electric load from outside said casing, said power conversion circuit including a plurality of output ends to output said supply power to said electric load, wherein said plurality of output terminals are arranged divided into a first output terminal group located at one end side of said casing, and a second output terminal group located at the other end side of said casing, each of the plurality of output terminals being electrically separate members, wherein each of the first output terminals being arranged to be electrically connectable to a respective second output terminal by a busbar disposed within the projection profile of a perimeter of the casing, wherein at least one of said first and second output terminal groups is electrically connected to said plurality of output ends of said power conversion circuit, and wherein the power module being configured to output from the first and second output terminal groups to the electric load when at least one of the first output terminals of the first output terminal group is connected to a respective second output terminal of the second output terminal group by the busbar.

7. The power module according to claim 6, wherein said first and second output terminal groups are electrically connected to each other by the busbar arranged within a projection profile of a perimeter of said casing.

8. The power module according to claim 1, said power module being mounted on a vehicle including an alternating current motor that functions as a vehicle driving source, wherein said power conversion circuit includes an inverter converting direct-current power from a secondary battery functioning as said power source into alternating current power to drive said alternating current motor functioning as said electric load.

9. The power module according to claim 1, wherein said projection profile of said perimeter of said casing is a projection profile viewed from a predetermined direction.

10. The power module according to claim 6, wherein at least one output terminal of said first output terminal group and at least one output terminal of said second output terminal group are electrically connected to a common one of output ends of said power conversion circuit.

* * * * *